(12) United States Patent
Grossman et al.

(10) Patent No.: US 10,439,291 B2
(45) Date of Patent: Oct. 8, 2019

(54) RADIO FREQUENCY SURFACE WAVE ATTENUATOR STRUCTURES AND ASSOCIATED METHODS

(71) Applicant: The Johns Hopkins University, Baltimore, MD (US)

(72) Inventors: Kenneth R. Grossman, Olney, MD (US); Joseph A. Miragliotta, Ellicott City, MD (US); Adam J. Maisano, Sykesville, MD (US); Douglas B. Trigg, Elkton, MD (US)

(73) Assignee: The Johns Hopkins University, Baltimore, MD (US)

( * ) Notice: Subject to any disclaimer, the term of this patent is extended or adjusted under 35 U.S.C. 154(b) by 39 days.

(21) Appl. No.: 15/884,426

(22) Filed: Jan. 31, 2018

(65) Prior Publication Data

US 2018/0287261 A1    Oct. 4, 2018

Related U.S. Application Data

(60) Provisional application No. 62/481,153, filed on Apr. 4, 2017.

(51) Int. Cl.
*H03H 7/24* (2006.01)
*H01Q 15/00* (2006.01)
*H01Q 17/00* (2006.01)
*H01Q 1/52* (2006.01)
*H01R 4/48* (2006.01)

(52) U.S. Cl.
CPC ............. *H01Q 15/008* (2013.01); *H01Q 1/52* (2013.01); *H01Q 17/007* (2013.01); *H01Q 17/008* (2013.01); *H01R 4/48* (2013.01); *H03H 7/24* (2013.01)

(58) Field of Classification Search
CPC ...... H01Q 15/008; H01Q 1/52; H01Q 17/007; H01Q 17/008; H01P 1/22; H01P 1/222; H03H 7/24; H03H 11/24
USPC .............................................. 333/81 R, 81 B
See application file for complete search history.

(56) References Cited

U.S. PATENT DOCUMENTS

| | | |
|---|---|---|
| 5,276,277 A | 1/1994 | Hightower et al. |
| 5,400,043 A | 3/1995 | Arceneaux et al. |
| 5,496,966 A | 3/1996 | Hightower et al. |
| 5,767,789 A | 6/1998 | Afzali-Ardakani et al. |
| 5,910,710 A | 6/1999 | Simpson |
| 6,147,302 A | 11/2000 | Matsuo et al. |
| 6,262,495 B1 | 7/2001 | Yablonovitch et al. |
| 6,483,481 B1 | 11/2002 | Sievenpiper et al. |

(Continued)

*Primary Examiner* — Stephen E. Jones
(74) *Attorney, Agent, or Firm* — Noah J. Hayward

(57) ABSTRACT

A radio frequency surface wave attenuator structure is provided. The structure may be configured to be operably coupled with a plurality of other radio frequency surface wave attenuator structures to form a metamaterial. The radio frequency surface wave attenuator structure may include a patch disposed in a first plane and defining a patch area and a backplane disposed in a second plane and extending along the second plane to be shared with the other surface wave attenuator structures. The structure may further include a via spring having a number of turns and being comprised of a conductive material. The via spring may electrically couple the patch to the backplane. The structure may further include a dielectric disposed between the patch and the backplane.

17 Claims, 8 Drawing Sheets

(56) References Cited

U.S. PATENT DOCUMENTS

| | | |
|---|---|---|
| 6,756,932 B1 | 6/2004 | Barker et al. |
| 6,870,090 B2 | 3/2005 | Agrawal et al. |
| 7,136,029 B2 | 11/2006 | Ramprasad et al. |
| 7,197,800 B2 | 4/2007 | Sievenpiper et al. |
| 7,936,310 B2 | 5/2011 | Aiga et al. |
| 8,029,582 B2 | 10/2011 | Gonze et al. |
| 8,063,833 B2 | 11/2011 | Sievenpiper |
| 8,339,320 B2 | 12/2012 | Sievenpiper |
| 8,385,873 B2 | 2/2013 | Zhou et al. |
| 8,514,036 B2 | 8/2013 | Mckinzie, III |
| 8,830,126 B2 | 9/2014 | Maruyama et al. |
| 8,847,822 B2 | 9/2014 | Maruyama et al. |
| 8,988,287 B2 | 3/2015 | Maruyama et al. |
| 9,000,869 B2 | 4/2015 | Mckinzie, III |
| 9,173,333 B2 | 10/2015 | Song et al. |
| 9,208,362 B1 | 12/2015 | Fink et al. |
| 9,208,913 B2 | 12/2015 | Liu et al. |
| 9,236,214 B2 | 1/2016 | Watson |
| 9,362,601 B2 | 6/2016 | Mckinzie, III |
| 9,465,965 B1 | 10/2016 | Fink et al. |
| 9,513,171 B2 | 12/2016 | Cumming et al. |
| 9,622,338 B2 | 4/2017 | Song et al. |
| 9,652,646 B1 | 5/2017 | Fink et al. |
| 2003/0052757 A1* | 3/2003 | McKinzie, III ...... H01Q 15/008 335/6 |

* cited by examiner

RADIO FREQUENCY SURFACE WAVE ATTENUATOR STRUCTURES AND ASSOCIATED METHODS

CROSS-REFERENCE TO RELATED APPLICATIONS

This application claims priority to and the benefit of prior-filed U.S. Provisional Application Ser. No. 62/481,153, filed Apr. 4, 2017, the content of which is herein incorporated by reference in its entirety.

STATEMENT OF GOVERNMENTAL INTEREST

This invention was made with Government support under contract number FA8222-16-C-0005 awarded by the United States Air Force. The Government has certain rights in the invention.

TECHNICAL FIELD

Example embodiments generally relate to the propagation of electromagnetic fields and waves and, in particular, relate to approaches for attenuating fields and waves.

BACKGROUND

As radio communication devices become increasingly ubiquitous, it has become increasingly important to be able to construct physical structures (e.g., buildings and, in particular interior spaces of buildings) that operate to limit or eliminate electromagnetic interference internal to the structure. Such physical structures and spaces can offer improved internal communications due to elimination of outside sources. In some instances, the radio frequency signals and noise may propagate along surfaces, such as walls and floors, as surface waves. Such surface waves may propagate until they reach certain types of discontinuities, such as a crack in a door or window frame, and then the surface waves may be re-radiated from the discontinuity an into the open space thereby introducing electromagnetic interference into the structure. Also, information-bearing signals generated inside the structure could escape in a similar fashion permitting the intercept of sensitive information by another party, for example, that is external to the structure. Therefore, when constructing such physical structures and spaces, it would be desirable to have the ability to inhibit or prevent the propagation of such surface waves.

BRIEF SUMMARY OF SOME EXAMPLES

According to some example embodiments, a radio frequency surface wave attenuator structure is provided that may be configured to be operably coupled with a plurality of other radio frequency surface wave attenuator structures to form a metamaterial. The radio frequency surface wave attenuator structure may comprise a patch comprising a conductive material. The patch may be disposed in a first plane and define a patch area. The structure may further comprise a backplane comprising a conductive material. The backplane may be disposed in a second plane. The conductive backplane surface extends along the second plane to be shared with the other surface wave attenuator structures. The structure may further comprise a via spring having a number of turns and also comprised of a conductive material. The via spring may electrically couple the patch to the backplane. The structure may further comprise a dielectric disposed between the patch and the backplane.

According to some example embodiments, another radio frequency surface wave attenuator structure is provided. The structure may comprise a patch comprising a conductive material. The patch may be disposed in a first plane and define a patch area. A capacitance of the structure may be based on the patch area. The structure may further comprise a backplane comprising a conductive material. The backplane may be disposed in a second plane. The first plane may be substantially parallel to the second plane. Further, the capacitance of the structure may be based on a distance between the first plane and the second plane. The structure may further comprise a via spring having a number of turns and comprised of a conductive material. The via spring may be under mechanical compression and exert a patch force in a direction of the patch to cause electrical coupling between the patch and the via spring and exert a backplane force in a direction of the backplane to cause electrical coupling between the backplane and the via spring. Further, an attenuation frequency for the structure may be based on the capacitance and inductance of the structure.

According to some example embodiments, a method for assembling a radio frequency surface wave attenuator structure is provided. The method may comprise physically coupling a via spring with a retainer. In this regard, the via spring may have a number of turns and may be comprised of a conductive material. An inductance of the structure may be based on the number of turns in the via spring. The method may further comprise mechanically compressing the via spring between a patch and a backplane. In this regard, the patch and the backplane comprise a conductive material and the patch may define a patch area. A capacitance of the structure may be based on the patch area. The method may further comprise affixing the patch to a standoff at a first plane and affixing a backplane to the standoff at a second plane. In this regard, the via spring may be disposed between the patch and the backplane and maintained in position by the retainer. The via spring may be under compression thereby exerting a patch force in a direction of the patch to cause electrical coupling between the patch and the via spring and a backplane force in a direction of the backplane to cause electrical coupling between the backplane and the via spring. The first plane may be substantially parallel to the second plane and the capacitance of the structure may be based on a distance between the first plane and the second plane. The attenuation frequency for the structure is based on the capacitance and inductance of the structure.

BRIEF DESCRIPTION OF THE SEVERAL VIEWS OF THE DRAWING(S)

Having thus described some example embodiments in general terms, reference will now be made to the accompanying drawings, which are not necessarily drawn to scale, and wherein:

DETAILED DESCRIPTION

Figure 1:
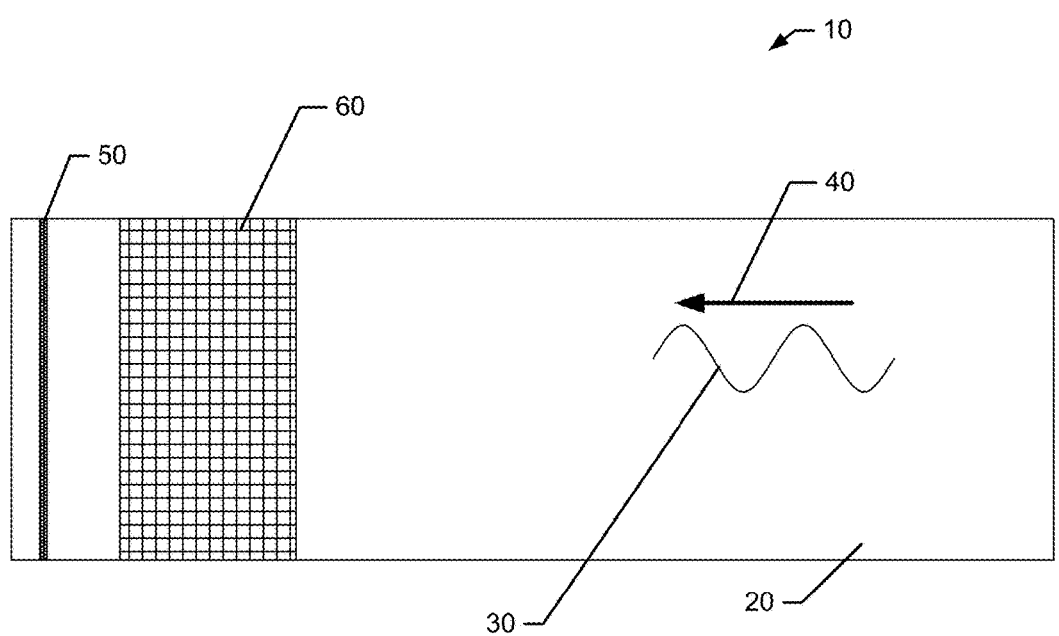
FIG. 1 illustrates an example surface wave propagating across a surface according to an example embodiment.

Some example embodiments now will be described more fully hereinafter with reference to the accompanying drawings, in which some, but not all example embodiments are shown. Indeed, the examples described and pictured herein should not be construed as being limiting as to the scope, applicability or configuration of the present disclosure. Rather, these example embodiments are provided so that this disclosure will satisfy applicable legal requirements. Like reference numerals refer to like elements throughout. As used herein, operable coupling should be understood to relate to direct or indirect connection that, in either case, enables functional interconnection of components that are operably coupled to each other.

As briefly discussed above, taking measures to attenuate radio frequency surface waves can be vital to the construction of electromagnetic interference (EMI) shielded structures (e.g., buildings, rooms, or the like), particularly near a penetration or discontinuity in a surface of the structure (e.g., wall, floor, or the like). To properly shield such structures, free space energy that may be coupled into such surfaces in the form of a surface wave should be prevented from reaching penetrations or discontinuities, thereby inhibiting re-radiation of the energy into the space. Such penetrations or discontinuities often exist near or at doors, windows, ventilation openings, cable pass-throughs, and the like.

Engineered metamaterials that operate to attenuate radio frequency surface waves offer one solution for inhibiting re-radiation in such spaces. In this regard, according to some example embodiments, metamaterials may be used to attenuate such waves. Such metamaterials may, for example be built using a "mushroom" structure that is generally comprised of a patch that is centrally connected and electrically coupled by a via to a backplane. A dielectric may be disposed between the patch and the backplane. Such a structure can be designed to operate as a resonant circuit, and the structures may be repeated into an array to form a metamaterial sheet that can be applied to surfaces to attenuate radio frequency surface waves for a band of frequencies.

An operating frequency of such a resonant structure may be primarily driven by a capacitance and inductance of the structure. In this regard, as design parameters are changed to increase the capacitance or inductance, the resultant operating frequency may decrease. Increasing the inductance increases the circuit bandwidth, while increasing the capacitance decreases bandwidth. Therefore, increasing inductance may be preferred to decrease the operating frequency while maintaining or increasing the bandwidth of operation.

Further, the operating frequency and bandwidth of the structure may be governed by the capacitance formed between patches in an array and the inductance formed by the patches, vias, and backplane. To reach lower operating frequencies, while retaining a useful bandwidth, the inductance can be increased, for example, by adding, magnetic materials to the dielectric or increasing the distance between patch and the backplane (i.e., the thickness of the metamaterial). However, as additional magnetic materials are added or the thickness increases, the weight or size of the metamaterial increases. Accordingly, to reach sub-gigahertz operating frequencies, a resulting metamaterial may weigh at least 2.5 pounds per square foot ($lb/ft^2$), even if a relatively light polymer is used in the structure. Such a relatively high weight may be problematic and not feasible for many applications.

Further, rather than using magnetic materials in the dielectric, a lighter weight structure could be formed if air were used as the dielectric. However, air has a very low permeability, and therefore use of air as the dielectric would again require the metamaterial to be thicker to attain desirable operating frequencies and bandwidth. In this regard, to reach a useful inductance with an air dielectric, based on the mushroom structure described above, the thickness of the structure would be required to be greater than 1 inch. Such a thickness may be problematic and not feasible for many applications. As such, a technical problem in this area of technology is to develop a structure for use in attenuating radio frequency surface waves that exhibits an increased inductance, without the associated drawbacks of being too thick and having relatively high weight.

Another technical problem of the mushroom structure described above can be fabrication of the structure, particularly with respect to the via. Some fabrication processes can require drilling a hole through the dielectric during assembly and plating or sputtering the drilled hole with metal to form the via between the patch and the backplane. Such plating or sputtering often involves metal evaporation or electroplating processes, both of which can be very capital equipment intensive processes. As such, another technical problem exists with developing an approach to forming a via that does not require costly equipment and processes.

According to various example embodiments, a technical solution to the problems described above, as well as other problems, is to employ a via spring in the construction of a metamaterial structure that can be used for radio frequency surface wave attenuation. In this regard, the via spring may be disposed between the patch and the backplane to operate as a via. Because the via spring is formed of a conductive material and includes a plurality of turns, the via spring provides the electrical connection between the patch and the backplane, while also introducing inductance into the structure. Accordingly, because of the introduction of the additional inductance, air may also be used as a dielectric, resulting in a relatively thin and light-weight structure for use in a radio frequency surface wave attenuating metamaterial. Further, the via spring may allow for assembly of the structure without requiring holes to be drilled or metal plating or sputtering. Rather, the structure may be assembled by placing the via spring in position with a retainer and allowing for subsequent compression of the via spring between the patch and the backplane to secure the patch, the via springs, and backplane in place. The compressed via spring may also be assembled under compression to apply a force on both the patch and the backplane to form an electrical coupling with both the patch and the backplane. According to some example embodiments, such electric coupling with the via spring may be established through the compression forces only and may not require soldering, welding, otherwise affixing of the via spring to either of the patch or the backplane other than through compression forces provided by the via spring.

Further, the air dielectric may be realized by, for example, using only air in conjunction with a support frame or a structural foam comprised primarily of air or a light-weight skeletal frame. In either example approach, the frame or the foam may also operate as a standoff between the patch and the backplane to separate the patch and backplane a desired distance apart. In either example approach, a retainer may be provided in the form of, for example, a structural hole to accurately locate the via spring in the structure and prevent movement of the via spring. In this regard, the retainer may physically couple to at least a side of the via spring to provide physical support to the via spring and maintain the via spring in a position between the patch and the backplane.

According to some example embodiments, the via spring may be provided in the form of a conductive coiled spring. As such, the length, total number of turns, and a diameter of the via spring may determine the inductance that the via spring contributes to the circuit based on the following relationship:

$$L = \frac{\mu_0 * K * N^2 * A}{l}$$

where L is the inductance of the via spring, $\mu_0$ is the permeability of a vacuum, K is the Nagaoka coefficient (a geometric factor based on the cross-sectional area of the via spring and the length of the via spring), N is the number of turns in the via spring, A is the cross-sectional area of the via spring, and l is the length of the via spring. Using this relationship, it can be seen that several hundred nanoHenries (nH) may be introduced by the via spring with a length of approximately 1 centimeter thereby achieving operating frequencies below 1 gigahertz with thickness of 1 centimeter and an air core dielectric for the via spring and the structure. Thus, according to some example embodiments, a simple conductive coiled spring may be utilized at the via spring.

Further, due to the ease of assembly that is associated with use of the via spring, different spring designs (e.g., springs with different numbers of turns, lengths, or turn radii) may be used to fabricate structures having different inductances and therefore different operating frequencies based on an otherwise common structural design. In other words, a further advantage may be, according to some example embodiments, that different via springs may be used to change the metamaterial operating frequency by inserting a different via spring into the base structure during fabrication. Accordingly, various different operating frequencies may be achieved by structures through the use of, for example, one backplane, patch design, and foam or skeletal air dielectric to fabricate metamaterials with different properties by using different via springs with different structures. Additionally, by, for example, patterning varied via springs into the dielectric material, a graded metamaterial structure may also be realized in accordance with some example embodiments. Thus, according to various example embodiments, as further described in more detail below, the via spring allows for the use of air as the dielectric, thereby dramatically reducing the weight and size of a resulting metamaterial that can achieve sub-gigahertz surface wave attenuation. According to some example embodiments, a resulting metamaterial built using a structure with the via spring can achieve exceptional attenuation performance at, for example, frequencies of 400 megahertz and potentially lower, with a weight of 0.5 lb/ft$^2$ or less, and thicknesses of 1 centimeter or less.

In light of the forgoing, FIG. 1 illustrates an example space 10 with a surface 20 (e.g., a wall) that has been subjected to a radio frequency surface wave 30. In this regard, radio frequency surface wave 30 may be propagating in one or more directions including direction 40 on the surface 20 towards a discontinuity 50 (e.g., a crack in a door frame or window jam). If the radio frequency surface wave 30 were to reach the discontinuity 50, the radio frequency surface wave 30 may be re-radiated into the space 10. However, metamaterial 60 which, according to some example embodiments, has been tuned to attenuate waves having the frequency of radio frequency surface wave 30, has been applied to the surface 20 adjacent the discontinuity 50. As such, the radio frequency surface wave 30 is attenuated and the energy of the wave is scattered before the wave 30 can reach the discontinuity 50. Accordingly, electromagnetic interference that could have been released into the space 10 by the radio frequency surface wave 30 is prevented from radiating by operation of the metamaterial 60. According to various example embodiments, metamaterial 60 may be comprised of any number of radio frequency surface wave attenuating structures that are formed into an array and provided as a sheet for application to a surface, such as surface 20.

Figure 2:
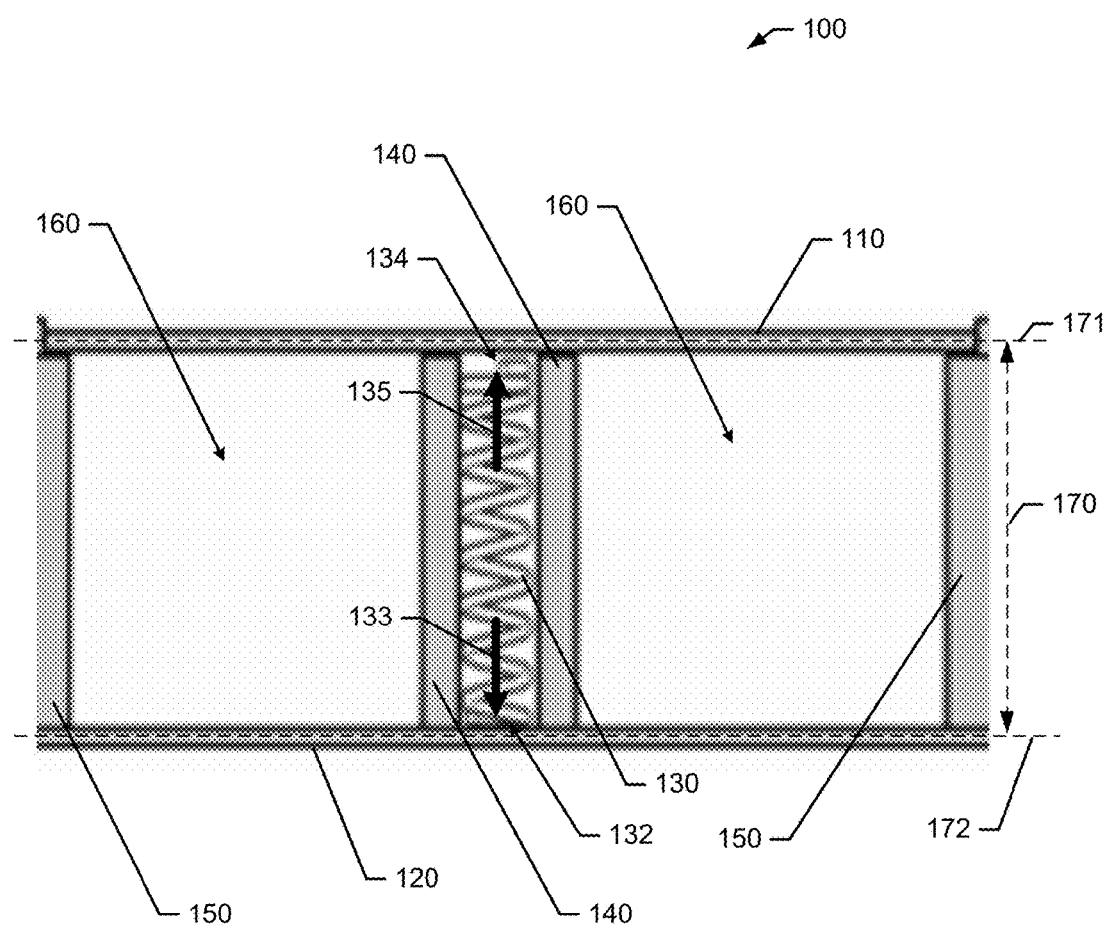
FIG. 2 illustrates a side cross-section view of an example radio frequency surface wave attenuator structure according to an example embodiment.

FIG. 2 shows a cross-section side view of an example radio frequency surface wave attenuator structure 100, in according to some example embodiments. The structure 100 may include a patch 110, a backplane 120, and a via spring 130. The structure 100 may also include a dielectric. As described in further detail below, the structure 100 may be combined with any number of similar radio frequency surface wave attenuator structures in an array to form a metamaterial sheet that may be applied to various surfaces.

The patch 110 of the structure 100 may be formed of any type of conductive material and may be shaped as, for example, a flat plate. In this regard, the cross-section view of FIG. 2 shows patch 110 as a flat plate, but the top and bottom surfaces of the patch 110 may take a broader geometric shape such as a square, rectangle, circle, oval, triangle, or the like. Each structure 100 may include a dedicated patch 110 that is physically isolated from the patches of other structures in an array by, for example, a gap or a post. The patch 110 may be disposed on what may be considered a top side of the structure 100 for reference purposes.

Further, the patch 110 may be disposed along a first plane 171 of the structure 100. Patch 110 may be operably coupled to non-conductive standoffs 150 at least some edges or other portions of the patch 110. According to some example embodiments, the patch 110 may be affixed (using adhesives, fasteners, or the like) to the standoffs 150 to hold the patch 110 in place after assembly of the structure 100 is complete. Further, patch 110 may also be operably coupled to the retainer 140, which may take the form of, for example, a tube. Additionally, the patch 110 may be electrically coupled to the via spring 130 as further described herein.

The structure 100 may also include a backplane 120, which may disposed on a bottom side of the structure 100 (opposite the patch 110). The backplane 120 may comprised of a conductive material and may also be formed as a flat plate. According to some example embodiments, the backplane 120 may extend to the edges of an array of structures 100 and therefore the backplane 120 extend such that the backplane 120 is shared amongst a number of structures 100. The backplane 120 may be disposed along a second plane 172, which, according to some example embodiments, may be parallel to first plane 171. As such, the backplane 120 may be parallel to patch 110, thereby, according to some example embodiments, forming parallel plates.

Backplane 120 may be operably coupled to non-conductive standoffs 150 on bottom side of the standoffs 150. As such, standoffs 150 may define a distance 170 between the patch 110 and the backplane 120, and a capacitance of the structure 100 may be based on the distance 170. According to some example embodiments, the backplane 120 may be affixed (using adhesives, fasteners, or the like) to the standoffs 150 to hold the backplane 120 in place after assembly of the structure 100 is complete. Further, backplane 120 may also be operably coupled to the retainer 140. Additionally, the patch 110 may be electrically coupled to the via spring 130 as further described herein.

The structure 100 may also include the via spring 130, which operates to electrically couple the patch 110 to the backplane 120. The via spring 130 may be a coil spring having a number of turns and formed of a conductive material. As mentioned above, the attributes of the via spring 130 cause the via spring 130 operate in both an electrical and mechanical role in the structure 100. In this regard, due to the number of turns, the cross-sectional area of the turns, and a length (e.g., distance 170) of the via spring 130, the via spring 130 may operate, electrically, as an inductor in the resonant circuit of the structure 100 thereby introducing inductance into the circuit. Additionally, the via spring 130 may operate, mechanically, in response to being placed under compression, to form strong physical connections to both the patch 110 and the backplane 120 which generate reliable electrical connections with the patch 110 and the backplane 120. It is contemplated that the physical coupling between the via spring 130 and either or both of the patch 110 and the backplane 120 may be indirect such that an intermediate conductive member could be included on either or both ends of the via spring 130 to thereby create a similar physical coupling without direct contact between the via spring 130 and the patch 110 or the backplane 120.

In this regard, the via spring 130 may be disposed between the patch 110 and the backplane 120. A retainer 140, which in this case may be formed as a tube, may operate to physically hold the via spring 130 in place between the patch 110 and the backplane 120, by, for example, physically coupling with a side or sides of the via spring 130. The via spring 130 may be disposed such that a center axis of the via spring 130 (i.e., central to the turns of the via spring 130) may be orthogonal or substantially orthogonal to the patch 110 and the backplane 120. Further, the center axis of the via spring 130 may be aligned with a center point of the shape of the patch 110 (e.g., center of the circle, square, rectangle, etc.).

As mentioned earlier, the via spring 130 may be mechanically compressed during between the patch 110 and the backplane 120 assembly of the structure 100. Due to this compression, a patch force 135 may be applied on the patch 110 by the via spring 130. However, since the patch 110 may be affixed (using adhesives, fasteners, or the like) to the standoffs 150, the patch 110 may remain stationary despite the force 135 being applied by the via spring 130. As such, a physical and electrical compression connection 134 between the via spring 130 and the patch 110 may be formed. According to some example embodiments, only the force 135 may be needed to form the connection 134 and no welding or soldiering may be required, although welding and soldiering could be utilized if desired. As such, according to some example embodiments, via spring 130 may not be affixed to the patch 110 but may remain in operable coupling with the patch 110 due to the compression of the via spring 130 and the operation of the retainer 140 to hold the via spring 130 in position.

Additionally, due to the compression of the via spring 130, a backplane force 133 may be applied on the backplane 120 by the via spring 130, but since the backplane 120 may be affixed (using adhesives, fasteners, or the like) to the standoffs 150, the backplane 120 may remain stationary despite the force 133 being applied by the via spring 130. As such, a physical and electrical compression connection 132 between the via spring 130 and the backplane 120 may be formed. According to some example embodiments, only the force 133 may be needed to form the connection 132 and no welding or soldiering may be required, although welding and soldiering could be utilized if desired. As such, according to some example embodiments, via spring 130 may not be affixed to the backplane 120 but may remain in operable coupling with the backplane 120 due to the compression of the via spring 130 and the operation of the retainer 140 to hold the via spring 130 in position.

The structure 100 may also include dielectric cavities 160 within which a dielectric may be disposed. The dielectric cavities 160 may be disposed adjacent to the via spring 130 and between the patch 110 and the backplane 120. In this regard, according to some example embodiments, the dielectric cavities 160 may retain a dielectric or dielectric material that supports the electrical operation of the structure 100. According to some example embodiments, the dielectric cavities 160 may retain air as the dielectric. In this regard, according to some example embodiments, more than 50% of the dielectric cavities 160 may be filled with air, more than 75% of the dielectric cavities 160 may filled with air, or the like. According to some example embodiments, other lightweight materials, possibly in the form of gases, may be retained in the dielectric cavities 160 to operate as the dielectric. In some example embodiments, the dielectric cavities 160 may be filled a foam the encapsulates air in small pockets or bubbles in the foam.

The retainer 140 and the standoffs 150 may be formed in a variety of ways according to some example embodiments. In this regard, the retainer 140 and standoffs 150 may be formed of a non-conductive, insulator material. The retainer 140 and the standoffs 150 may generally function to provide structural support to the components of the structure 100. As such, the retainer 140 and the standoffs 150 may be formed in any manner to provide this function. Accordingly, the retainer 140 may be formed as a channel in a foam dielectric, where the via spring 130 is placed in a channel. The channel would therefore operate to support the via spring 130 by operably coupling with the sides of the via spring 130. Further, rather than the retainer 140 receiving the via spring 130 in channel, as in the cases of the tube or the channel, the retainer 140 may one or a set of complementary posts that are disposed in the center of the via spring 130 to hold the via spring 130 in place. Further, the retainer 140 need not extend the entire distance between patch 110 and the backplane 120. Rather, according to some example embodiments, the retainer 140 may be a ring that does not extend from the patch 110 to the backplane 120 and may be operably coupled to the standoffs 150 to hold the via spring 130 in place between the patch 110 and the backplane 120. As such, the retainer 140 may generally operate to physically couple to at least a side of the via spring 130 to provide physical support to the via spring 130 and maintain the via spring 130 in a position between the patch 110 and the backplane.

Similarly, the standoffs 150 may be embodied in a number of ways while providing the functions of providing a member to which the patch 110 and the backplane 120 may be affixed in the structure 100 and defines the distance 170 between the patch 110 and the backplane 120. As such, according to some example embodiments, the retainer 140 and the standoffs 150 could be an integrated member, for example, in the form of a tube that extends from the backplane 120 to the patch 110 and includes top and bottom surfaces to facilitate affixing the patch 110 to the top surface of the tube and the bottom surface of the tube (while also retaining the via spring 130 in the interior of the tube). Further, in an example embodiment where the dielectric cavities 160 are filled with a foam that becomes rigid, the standoffs 150 may be the structure of the foam, where the foam is provided to have a height to create the desired distance 170 between the patch 110 and the backplane 120.

As described above, the structure 100 operates, electrically, to attenuate radio frequency surface waves of a certain frequency and bandwidth. To do so, the structure 100 electrically forms a resonant circuit with capacitance and inductance parameters. The capacitance may be based on, and a function of, the area of the patch 110 and the distance 170 between the patch 110 and the backplane 120, which introduce capacitance into the resonant circuit by operating as a parallel plate capacitor with a dielectric disposed therebetween. Further, the inductance of the resonant circuit may be based on, and a function of, the parameters of the via spring 130 (i.e., the number of turns, the radius of the turns, and the length of the via spring 130) as well as other aspects of the structure 100.

Figure 3A:
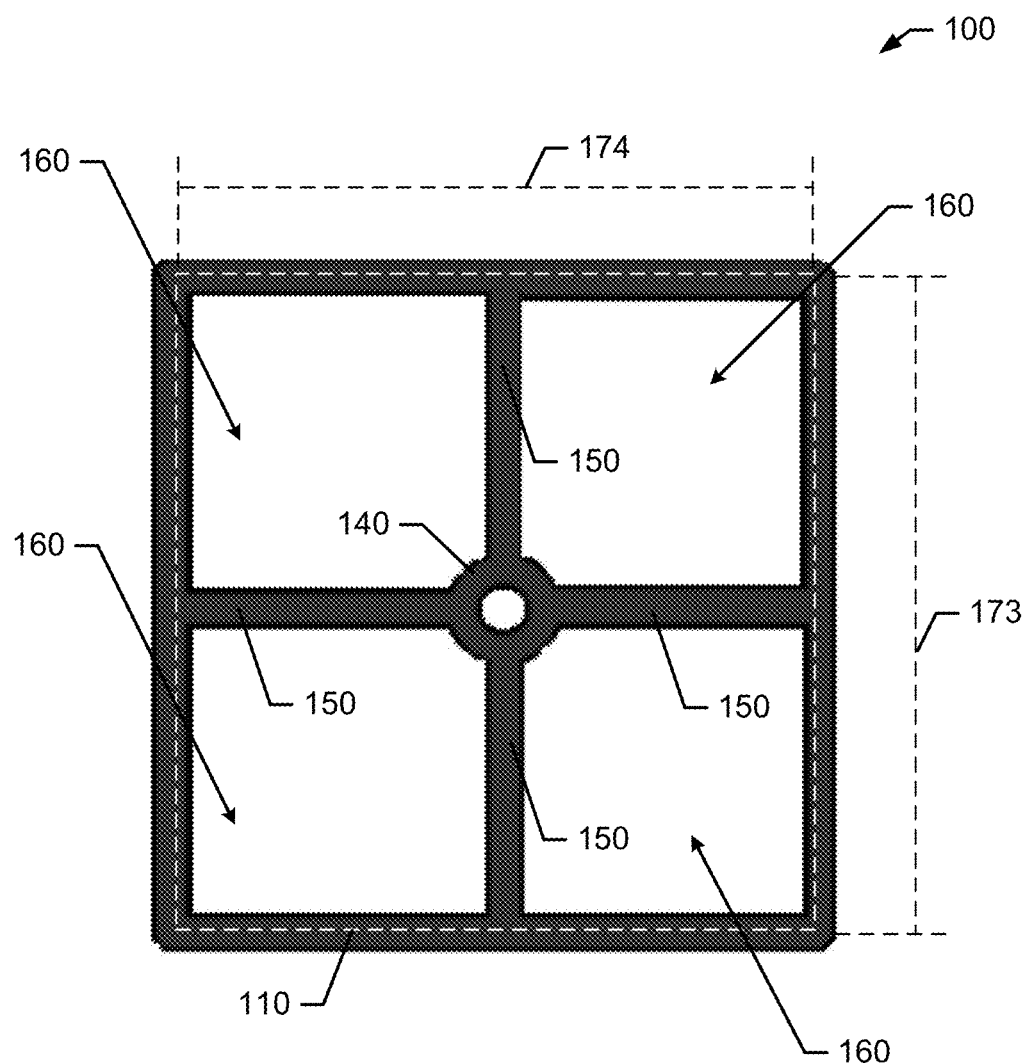
FIG. 3A illustrates a top view of some components of an example radio frequency surface wave attenuator structure including a frame according to an example embodiment.

FIG. 3A provides a top view of some components of a structure 100 where the standoffs 150 and retainer 140 are part of a frame which may be formed of, for example, injection molded plastic. In this regard, patch 110 is shown as having a square shape with dimensions 173 and 174 to define an area of the patch 110. Further, the retainer 140 is formed as a tube with an internal space for receiving the via spring 130 (not shown in FIG. 3). The retainer 140 may be integrated with standoffs 150, which also physically couple the retainer 140 to the exterior frame. The frame may be one unit of a larger frame used to form a metamaterial. The patch 110 and the backplane 120 may be affixed to the standoffs 150 or the top and bottom edges of the retainer 140.

Figure 3B:
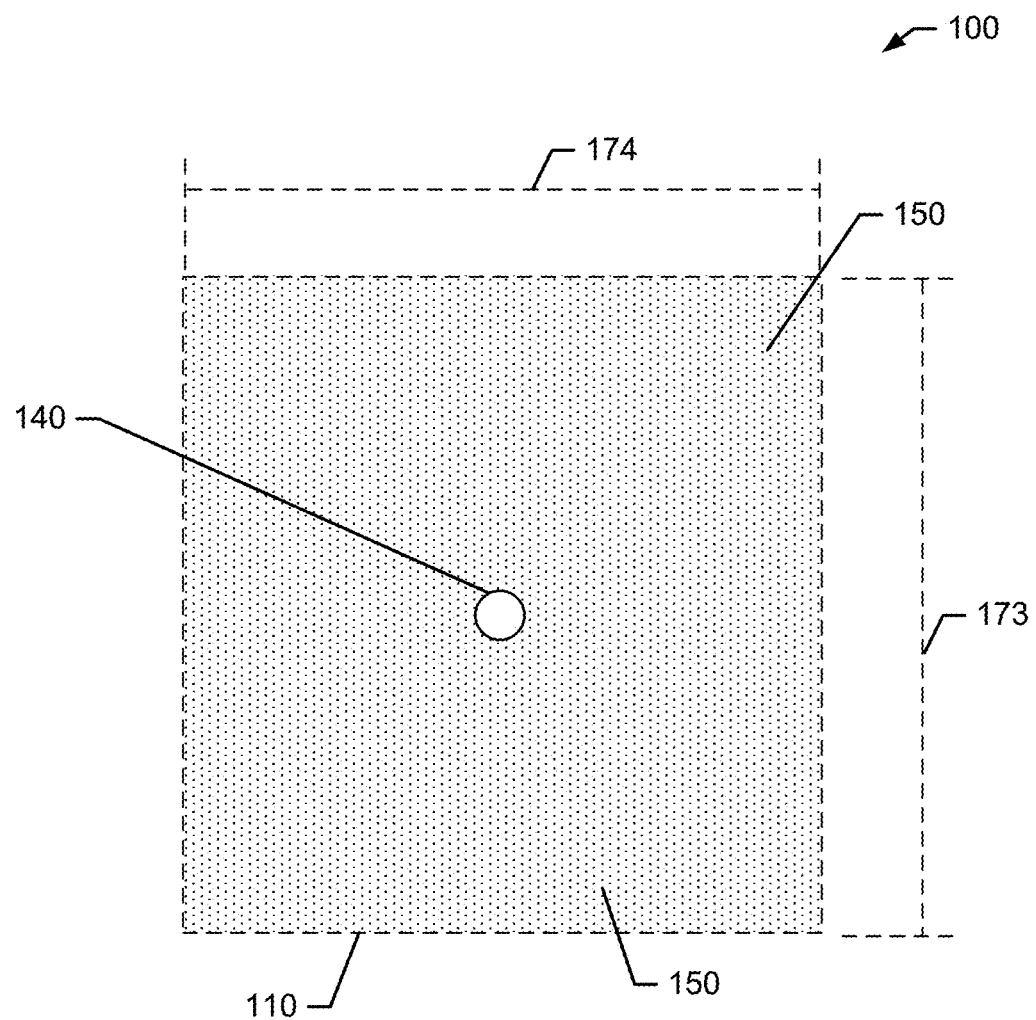
FIG. 3B illustrates a top view of some components of an example radio frequency surface wave attenuator structure including foam according to an example embodiment.

FIG. 3B provides a top view of some components of another structure 100 where the standoffs 150 and retainer 140 are integrated into a foam 180 that has cured into a rigid form. In this regard, while FIG. 3 shows only one representative structure 100, flowable foam forming air pockets or bubbles may be released into a mold to form a sheet that can be used to assemble a number of structures 100. The foam 180 may cure and harden to provide structural support for affixing the patch 110 and the backplane 120 (not shown in FIG. 3B) to form a structure 100. A channel for receiving the via spring 130 (not shown in FIG. 3B) may be created in the foam 180 to form the retainer 140, which may be formed as part of the mold or by cutting or drilling a hole after the foam 180 has cured. The rigid structure of the foam 180, having a defined height, may form the standoffs 150 and thus define the spacing between the patch 110 and the backplane 120. Again, patch 110 is shown as having a square shape with dimensions 173 and 174 to define an area of the patch 110.

Figure 4:
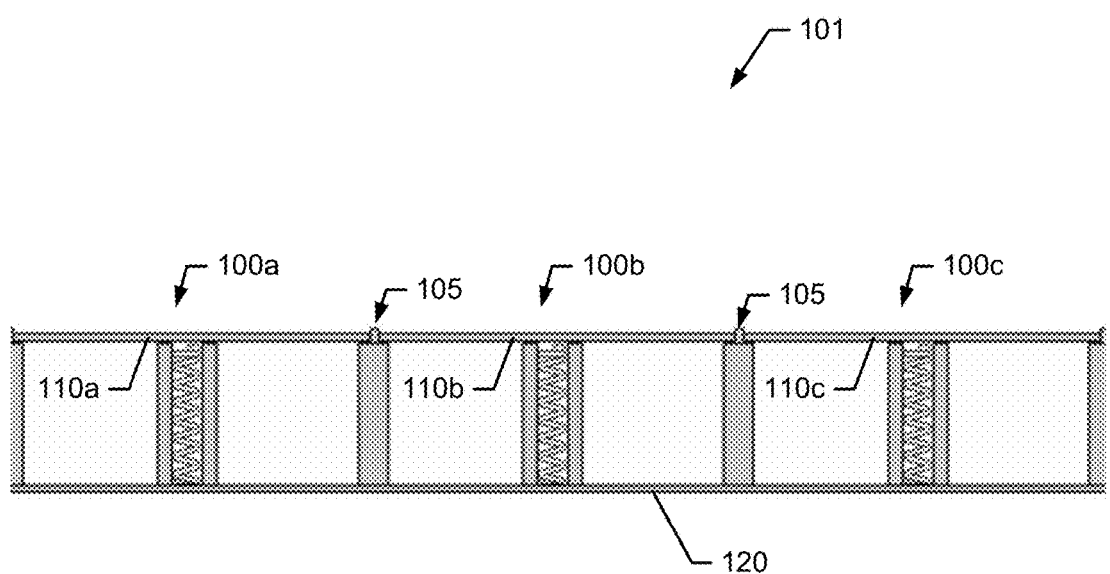
FIG. 4 illustrates a side cross-section view of an example array of radio frequency surface wave attenuator structures according to an example embodiment.

Having described a singular building-block structure 100 for radio frequency surface wave attenuation, FIGS. 4 and 5 will now be described which employ the example structure 100 in an array of structures to form a metamaterial that together operate to attenuate radio frequency surface waves as a larger sheet. In this regard, FIG. 4 shows a cross-section view of a metamaterial 101 with three example structures 100a, 100b, and 100c, having patches 110a, 110b, and 110c, respectively. As shown in FIG. 4, the patches 110a, 110b, and 110c are physically isolated from each other by gaps 105, which may be formed by a respective post on a standoff. Additionally, it can be seen that backplane 120 extends to and is therefore shared by each of the structures 100a, 100b, and 100c. One of skill in the art would appreciate that while FIG. 4 shows only three structures 100a, 100b, and 100c, an array of structures may be constructed with additional adjacent structures that may or may not be viewable in the cross-section shown in FIG. 4 due to their position.

Figure 5:
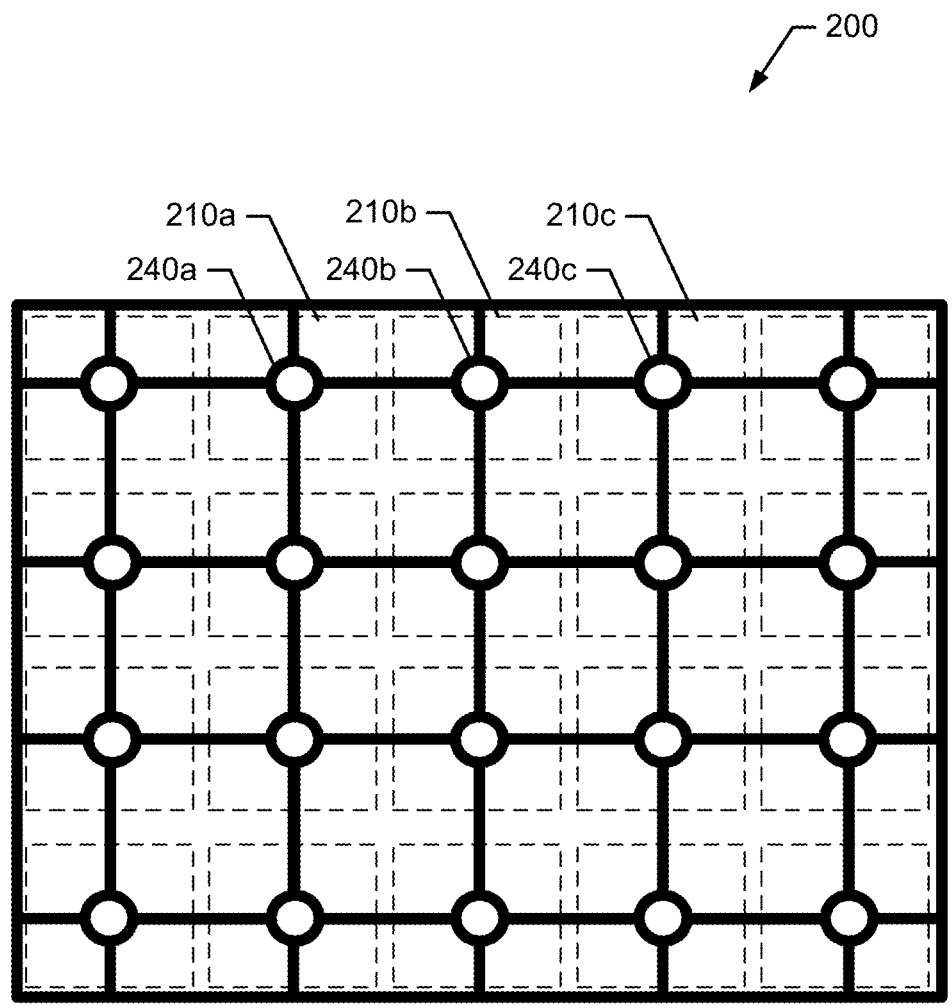
FIG. 5 illustrates a top view of some components of an example array of radio frequency surface wave attenuator structures according to an example embodiment.

FIG. 5 shows a top view of another metamaterial 200, where a two dimensional array of structures can be seen. In this regard, the metamaterial 200 may obtain structural support from a frame similar to that shown in FIG. 3A. The metamaterial 200 is depicted as a 4×5 array of structures, but one of skill in the art would appreciate that any size n×m array could be constructed to form the metamaterial 200. To provide context, the frame of the metamaterial 200 may include example retainers 240a, 240b, and 240c for receiving a respective via spring 130 (not shown). Further, each of the associated structures includes a patch 210a, 210b, and 210c, respectively.

Figure 6:
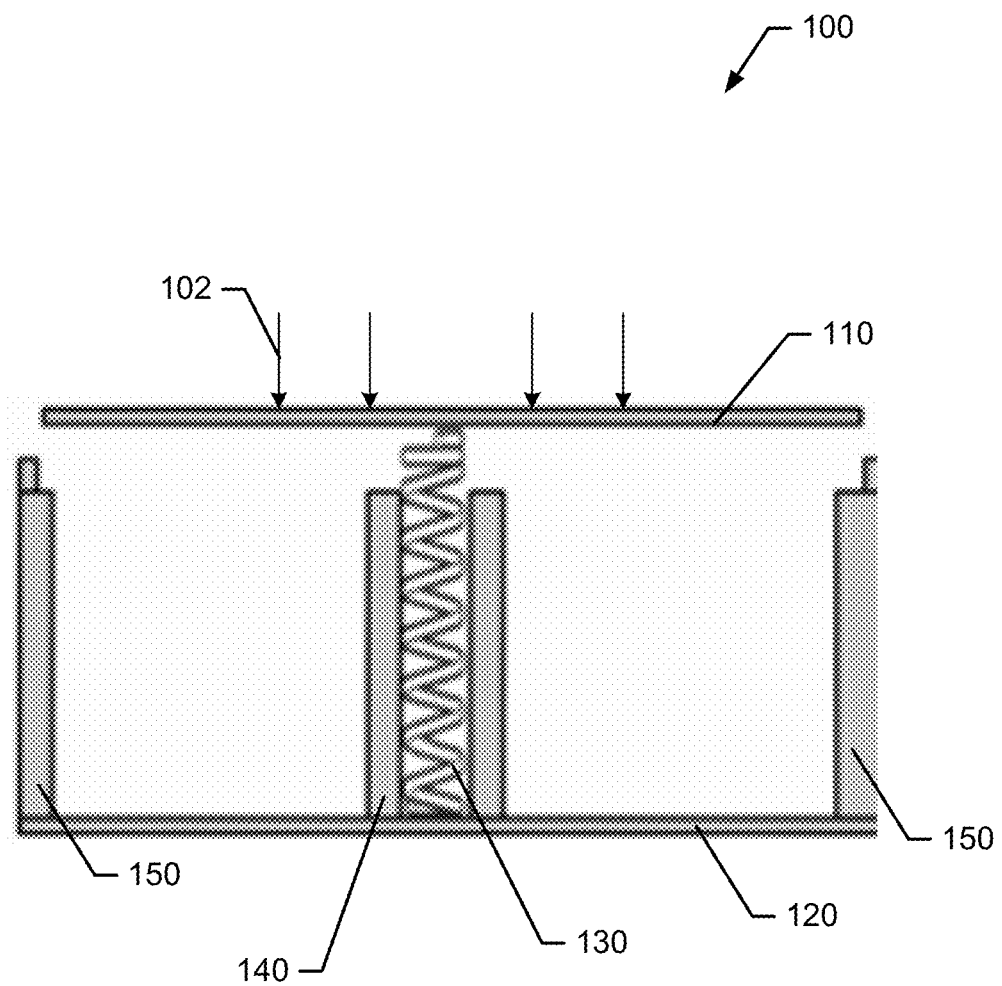
FIG. 6 illustrates a side cross-section view of an example radio frequency surface wave attenuator structure during assembly according to an example embodiment.

Having described various structures for use as radio frequency surface wave attenuators, FIGS. 6 and 7 will now be described with respect to assembly of such structures to highlight the advantages of using, for example, a via spring, such as the via spring 130 described herein. In this regard, FIG. 6 shows a structure 100 in the process of being assembled. At this point, the backplane 120 has been affixed to the standoffs 150 (using, for example, adhesives, fasteners, or the like) and the via spring 130 has been placed in the internal opening of the retainer 140. However, the via spring 130 is not yet under compression. The patch 110 may be placed on the via spring 130 and a force 102 may be applied to the patch 110 move the patch 110 into position to affix the patch 110 to the standoffs 150 and compress the via spring 130 (as shown in FIG. 2). As such, due to the compression of the via spring 130, strong physical coupling is formed between the via spring 130 and both the patch 110 and the backplane 120, thereby forming reliable electrical coupling as well, without the need to affix the via spring 130 to the patch 110 or the backplane 120, according to some example embodiments. While this process of compressing the via spring 130 is shown as the patch 110 being the affixed to the standoffs 150 after the backplane 120 is affixed to the standoffs 150, it is contemplated that a process could be used where the patch 110 is affixed to the standoffs 150 first, the via spring 130 is inserted from the bottom into the retainer 140, and then the force is applied to the backplane 120 to compress the via spring 130 and affix the backplane 120 to the standoffs 150.

Figure 7:
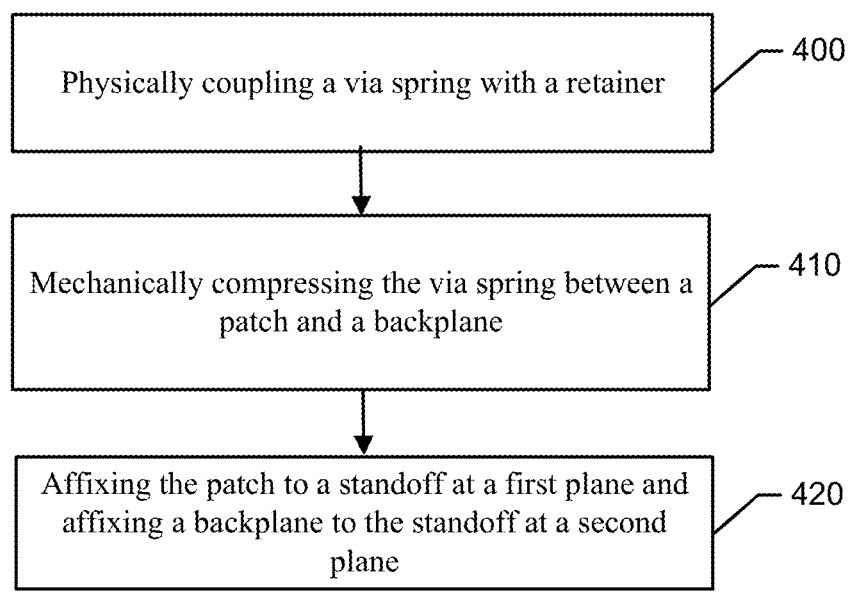
FIG. 7 illustrates a flowchart of an example method for assembling a radio frequency surface wave attenuator structure according to an example embodiment.

Now with reference to FIG. 7, a flowchart of an example method for assembling a radio frequency surface wave attenuator is provided. Note that it is contemplated that the following operations are not necessarily conducting the stated order, but could be conducted in a different order. In this regard, at 400, the example method may include physically coupling a via spring with a retainer. The via spring may have a number of turns and the via spring may be comprised of a conductive material. Further, an inductance of the structure being assembled may be based on the number of turns in the via spring. The example method may further comprise, at 410, mechanically compressing the via spring between a patch and a backplane. In this regard, the patch and the backplane may comprise a conductive material and the patch may define a patch area. Further, a capacitance of the structure may be based on the patch area. Additionally, the example method may include, at 420, affixing the patch to a standoff at a first plane and affixing a backplane to the standoff at a second plane. The via spring may be disposed between the patch and the backplane and maintained in position by the retainer. The via spring may be under compression thereby exerting a patch force in a direction of the patch to cause electrical coupling between the patch and the via spring. Further, compression of the via spring may exert a backplane force in a direction of the backplane to cause electrical coupling between the backplane and the via spring. Additionally, the first plane may be substantially parallel to the second plane and the capacitance of the structure may be based on a distance between the first plane and the second plane. Further, the attenuation frequency for the structure may be is based on the capacitance and inductance of the structure. Additionally, according to some example embodiments, the example method may include forming the standoff of an insulating material such that the standoff is physically coupled to the retainer. The standoff may be part of a frame that additionally has positions for a plurality of radio frequency surface wave attenuator structures to be assembled in association therewith.

Many modifications and other embodiments of the measuring device set forth herein will come to mind to one skilled in the art to which these inventions pertain having the benefit of the teachings presented in the foregoing descriptions and the associated drawings. Therefore, it is to be understood that the measuring devices are not to be limited to the specific embodiments disclosed and that modifications and other embodiments are intended to be included within the scope of the appended claims. Moreover, although the foregoing descriptions and the associated drawings describe exemplary embodiments in the context of certain exemplary combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. In cases where advantages, benefits or solutions to problems are described herein, it should be appreciated that such advantages, benefits and/or solutions may be applicable to some example embodiments, but not necessarily all example embodiments. Thus, any advantages, benefits or solutions described herein should not be thought of as being critical, required or essential to all embodiments or to that which is claimed herein. Although specific terms are employed herein, they are used in a generic and descriptive sense only and not for purposes of limitation.

What is claimed is:

1. A radio frequency surface wave attenuator structure configured to be operably coupled with a plurality of other radio frequency surface wave attenuator structures to form a metamaterial, the radio frequency surface wave attenuator structure comprising:
a patch comprising a conductive material, the patch being disposed in a first plane and defining a patch area;
a backplane comprising a conductive material, the backplane being disposed in a second plane, wherein the conductive backplane surface extends along the second plane to be shared with the other surface wave attenuator structures;
a via spring having a number of turns and being comprised of a conductive material, the via spring electrically coupling the patch to the backplane;
a dielectric disposed between the patch and the backplane; and
a retainer that physically couples to at least a side of the via spring to provide physical support to the via spring and maintain the via spring in a position between the patch and the backplane.

2. The structure of claim 1, wherein an attenuation frequency for the structure is based on at least the patch area of the patch and the number of turns in the via spring.

3. The structure of claim 1, wherein the dielectric comprises air.

4. The structure of claim 1 further comprising a foam disposed between the patch and the backplane.

5. The structure of claim 1 wherein the first plane is substantially parallel to the second plane.

6. The structure of claim 1 further comprising a dielectric, the dielectric comprising a foam.

7. The structure of claim 1, further comprising a standoff disposed between the patch and the backplane, wherein the patch and the backplane are affixed to the standoff and the standoff defines a distance between the patch and the backplane.

8. The structure of claim 7 further comprising a retainer that physically contacts at least a side of the via spring to provide physical support to the via spring and maintain the via spring in a position between the patch and the backplane; and
wherein the retainer is physically coupled to the standoff.

9. The structure of claim 1, wherein the via spring is electrically coupled to the patch through physical coupling between the via spring and the patch and wherein the via spring is electrically coupled to the backplane through physical coupling between the via spring and the backplane.

10. The structure of claim 9, wherein the via spring is under mechanical compression and exerts a patch force in a direction of the patch to cause the physical coupling and electrical coupling between the patch and the via spring and further exerts a backplane force in a direction of the backplane to cause the physical coupling and electrical coupling between the backplane and the via spring.

11. The structure of claim 10, wherein the electrical coupling between at least one of the via spring and the patch or the via spring and the backplane is only due to the physical coupling.

12. The structure of claim 10, wherein the via spring is not affixed to at least one of the patch or the backplane.

13. A radio frequency surface wave attenuator structure comprising:
a patch comprising a conductive material, the patch being disposed in a first plane and defining a patch area, a capacitance of the structure being based on the patch area;
a backplane comprising a conductive material, the backplane being disposed in a second plane, wherein the first plane is substantially parallel to the second plane, wherein the capacitance of the structure is based on a distance between the first plane and the second plane;
a via spring having a number of turns and being comprised of a conductive material; and a retainer that physically contacts at least a side of the via spring to provide physical support to the via spring and maintain the via spring in a position between the patch and the backplane, wherein the via spring is under mechanical compression and exerts a patch force in a direction of the patch to cause electrical coupling between the patch and the via spring and exerts a backplane force in a direction of the backplane to cause electrical coupling between the backplane and the via spring, and wherein an attenuation frequency for the structure is based on the capacitance and inductance of the structure.

14. The structure of claim 13 further comprising a dielectric, wherein the dielectric comprises air.

15. The structure of claim 13, further comprising a standoff disposed between the patch and the backplane, wherein the patch and the backplane are affixed to the standoff and the standoff defines the distance between the first plane and the second plane.

16. The structure of claim 15 further comprising a retainer that physically contacts at least a side of the via spring to provide physical support to the via spring and maintain the via spring in a position between the patch and the backplane; and wherein the retainer is physically coupled to the standoff.

17. A method for assembling a radio frequency surface wave attenuator structure, the method comprising:

physically coupling a via spring with a retainer, the via spring having a number of turns and being comprised of a conductive material, an inductance of the structure being based on the number of turns in the via spring;

mechanically compressing the via spring between a patch and a backplane, wherein the patch and the backplane comprise a conductive material and the patch defines a patch area, a capacitance of the structure being based on the patch area;

affixing the patch to a standoff at a first plane and affixing a backplane to the standoff at a second plane, the via spring being disposed between the patch and the backplane and maintained in position by the retainer, the via spring being under compression thereby exerting a patch force in a direction of the patch to cause electrical coupling between the patch and the via spring and a backplane force in a direction of the backplane to cause electrical coupling between the backplane and the via spring; and forming the standoff of an insulating material being physically coupled to the retainer, wherein the standoff and retainer are components of a frame having positions for a plurality of radio frequency surface wave attenuator structures, wherein the first plane is substantially parallel to the second plane and the capacitance of the structure is based on a distance between the first plane and the second plane, and wherein an attenuation frequency for the structure is based on the capacitance and inductance of the structure.

* * * * *